United States Patent
Bekke

(10) Patent No.: US 8,847,083 B2
(45) Date of Patent: Sep. 30, 2014

(54) PRINTED WIRING BOARD (PWB) WITH LANDS

(75) Inventor: Makoto Bekke, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 13/472,651

(22) Filed: May 16, 2012

(65) Prior Publication Data

US 2012/0325543 A1 Dec. 27, 2012

(30) Foreign Application Priority Data

Jun. 24, 2011 (JP) .................. 2011-140989

(51) Int. Cl.
*H05K 1/11* (2006.01)
*H05K 3/34* (2006.01)

(52) U.S. Cl.
CPC .............. *H05K 1/116* (2013.01); *H05K 3/3447* (2013.01)
USPC ........................................................ 174/266

(58) Field of Classification Search
USPC .......................................... 174/250, 262, 266
See application file for complete search history.

(56) References Cited

U.S. PATENT DOCUMENTS

| | | | |
|---|---|---|---|
| 6,423,906 B2 * | 7/2002 | Wang | 174/260 |
| 8,049,324 B1 * | 11/2011 | Zeta | 257/692 |

FOREIGN PATENT DOCUMENTS

| | | | | |
|---|---|---|---|---|
| CN | 201319699 Y | * | 9/2009 | |
| JP | 05021944 A | * | 1/1993 | ............... H05K 3/34 |
| JP | 5304353 A | | 11/1993 | |
| JP | 3003062 U | | 10/1994 | |
| JP | 7254774 A | | 10/1995 | |
| JP | 11068298 A | * | 3/1999 | ............... H05K 3/34 |
| JP | 411068298 A | * | 3/1999 | ............... H05K 3/34 |
| JP | 2000-208909 A | | 7/2000 | |
| JP | 2002-9449 A | | 1/2002 | |
| JP | 2003-142810 A | | 5/2003 | |
| TW | 403180 U | * | 5/2011 | |

OTHER PUBLICATIONS

Derwent document_CN_201319699_Y_H.pdf.*
Derwent document_TW_403180_U_H.pdf.*
Derwent document_JP_11068298_A_H.pdf.*
Clipped file_TW_403180_U_I.pdf.*
Clipped file_CN_201319699_Y_I.pdf.*
A Decision to Grant, dated Jul. 10, 2012 in JP Application No. 2011-140989.

* cited by examiner

*Primary Examiner* — Timothy Thompson
*Assistant Examiner* — Charles Pizzuto
(74) *Attorney, Agent, or Firm* — Lowe Hauptman & Ham, LLP

(57) ABSTRACT

A PWB having a plurality of through holes into which electronic parts' leads are inserted, and metal plated lands formed around the through holes. The metal plated lands are polygon in which the number of sides is an even number and each pair of facing sides are parallel, and the lands have circular concaves at all the corners and the sides of polygon are arranged to be parallel to the sides of the neighboring metal plated lands.

1 Claim, 6 Drawing Sheets

PRINTED WIRING BOARD (PWB) WITH LANDS

RELATED APPLICATIONS

The present application is based on, and claims priority from, Japanese Application Number 2011-140989, filed Jun. 24, 2011, the disclosure of which is hereby incorporated by reference herein in its entirety.

BACKGROUND OF THE INVENTION

1. Field of the Invention

The present invention relates to a printed wiring board (PWB) having a land shape which prevents solder bridges from occurring between neighboring lands when electronic parts are soldered by dipping into melting solder, and this invention has advantage in the number of wiring pattern between the lands.

2. Description of the Related Art

There is a dip soldering method for inserting electronic parts' leads into through holes provided on the PWB. The PWB is dipped into melting solder and electrically connected to the electronic parts' leads by solder.

Typically, the dip soldering has a problem that solder bridges easily occur so that solder ranges between the neighboring electronic parts' leads and it takes much time and cost to remove the bridges.

There are conventional techniques for preventing solder bridges from occurring between neighboring lands. One of them, there is a method for alternately arranging standard lands 70 each having a through hole 72 at its center and longitudinal lands 80 each having a through hole 82 at a deviated position from its center, and leading solder from the standard land 70 into the longitudinal land 80 in an arrow direction of numeral 78 as shown in FIG. 8 (see Japanese Patent Application Laid-Open No. 11-68298).

As another conventional technique, there is a method for forming lands 90, each having a through hole 92 at its center, in a rectangular shape (such as rhomboid) and arranging the lands 90 such that a long diagonal of the land matches with a wave solder carrying direction (in an arrow direction of numeral 95), thereby preventing solder bridges from occurring between neighboring lands as shown in FIG. 9 (see Registered Japanese Utility Model No. 3003062). Since the solder flows in an arrow direction of numeral 93 along the lands 90, the bridges easily break. The wave soldering is one of the dip soldering methods. The wave soldering uses a solder wave in a melting solder bath. The solder wave is brought into contact with a PWB, when the PWB is moved over the solder bath.

As still another conventional technique, there is a method for preventing solder bridges from occurring between neighboring lands by forming solder resist openings or lands in a protruded shape as shown in FIGS. 10A and 10B (see Japanese Patent Application Laid-Open No. 5-304353), or forming the same in a tapered and cutout shape as shown in FIG. 11A (see Japanese Patent Application Laid-Open No. 7-254774).

In FIGS. 10A and 10B, protrusions 66 are provided in the neighboring lands 60, and in FIG. 11A, tapers 106a, 106c and cutouts 106b, 106d are provided in the lands. As shown in FIG. 10A, the protrusions 66, 66 are provided in the lands 60, 60. As shown in FIG. 10B, an electrode pin 65 as electronic parts is inserted into a through hole 62. Then, the PWB 2 is dipped in the solder bath to be soldered to the lands 60. The protrusions 66 are provided so that an angle formed between solder 63 and the land 60 becomes smaller, and the solder bridges are prevented.

The above techniques are used for preventing solder bridges from occurring between neighboring lands, but have the following problems.

In the method shown in FIG. 8, longitudinal lands are needed and the area for mounting increases, which has disadvantage in achieving high component mounting density.

In the method shown in FIG. 9, since the carrying direction of PWB and the arrangement of the lands always forms correct angle, there is a problem that the arrangement direction of the parts is fixed relative to the carrying direction.

In the method shown in FIGS. 10A and 10B, the protrusions 66 make the gap between the lands 60 narrow, and thus it has disadvantage in the number of wiring patterns between the lands.

In the method shown in FIGS. 11A and 11B, the diagonal of the solder resist opening matches with the arrangement direction of lands. The ends of the square are furthest from the center and a gap between the neighboring solder resist openings is narrow. As shown in FIG. 11B, the conductive gaps 119 tends to be narrower, because they are defined by 4 factors (the accuracy of drill machining, the accuracy of solder resist, an amount of cutouts of solder resist, the amount of over-resist), and thus it has disadvantage in the number of wiring patterns between the lands.

SUMMARY OF THE INVENTION

It is the nature of the present invention to provide a PWB with lands which prevents solder bridges from occurring between neighboring lands. It doesn't increase area for mounting, besides it has advantage in the number of wiring patterns between the lands.

A PWB according to the present invention has a plurality of through holes into which electronic parts' leads are inserted and metal plated lands formed around the through holes, wherein the metal plated lands are polygon in which the number of sides is an even number and each pair of facing sides are parallel, and all the corners of the polygon have circular concaves, and the sides of the polygon are parallel to the corresponding sides of the neighboring metal plated lands.

The present invention provides a PWB with lands which prevents solder bridges from occurring between neighboring lands. It doesn't increase area for mounting, besides it has advantage in the number of wiring patterns between the lands.

BRIEF DESCRIPTION OF THE DRAWINGS

The above and other objects and characteristics of the present invention will be apparent from the following explanation of an embodiment with reference to the appended drawings. In which.

DETAILED DESCRIPTION OF THE PREFERRED EMBODIMENTS

Figure 1:
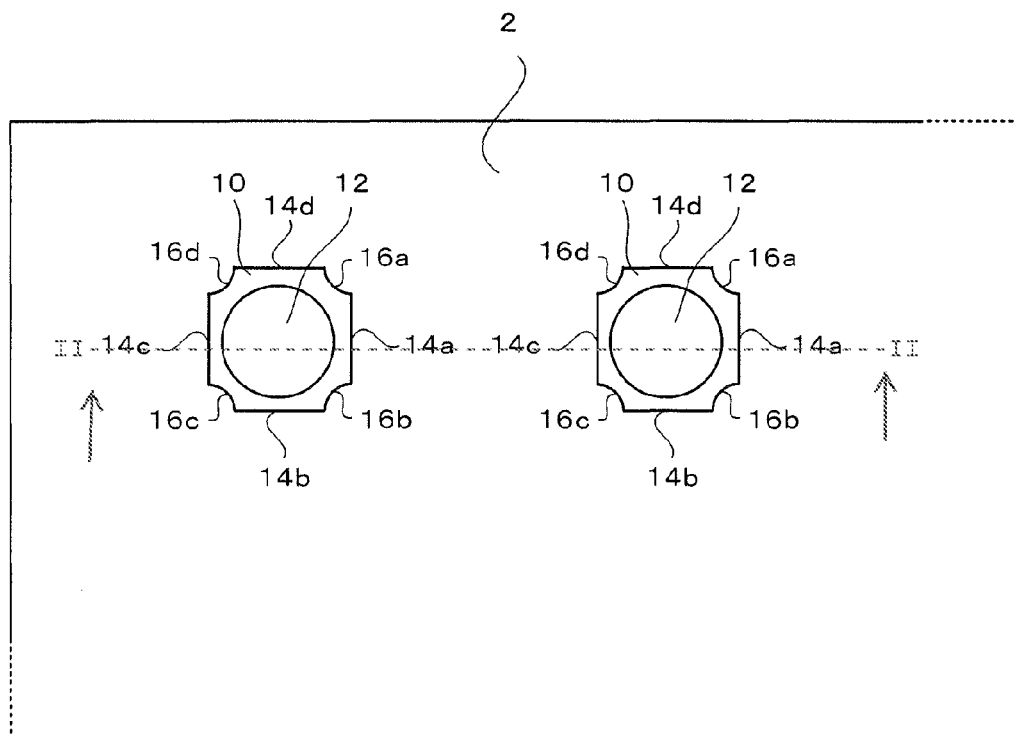
FIG. 1 is a diagram for explaining a case in which lands of a PWB according to the present invention are quadrangular.
Figure 2:
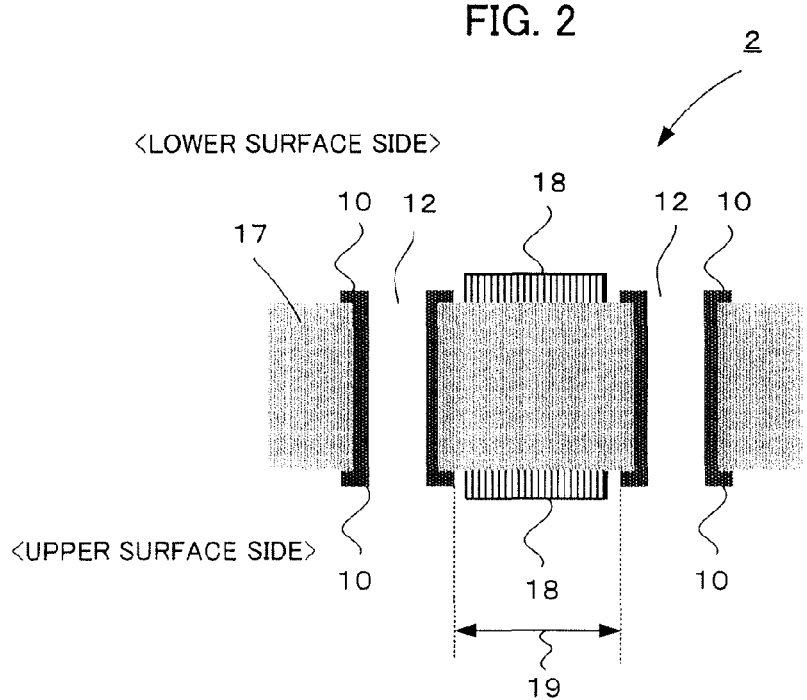
FIG. 2 is a cross-sectional view of FIG. 1.

FIG. 1 is a diagram for explaining a case in which lands of PWB according to the present invention are quadrangular. FIG. 2 is a cross-sectional view of FIG. 1.

PWB 2 has an insulating layer 17 made of a laminated plate of synthetic resin. The quadrangular lands 10 have excellent conductivity because of metal plating, these are around through holes 12 penetrating between the upper and lower surfaces of the insulating layer 17. The quadrangular lands 10 on the upper and lower surfaces of the PWB 2 are electrically connected through hole plating. Reference numeral 18 means solder resist. In FIG. 2, the quadrangular lands 10 are provided on the upper and lower surfaces of the PWB 2, in another application the lands are provided on the surface which contacts with a solder wave during soldering.

The through holes 12 are provided on the PWB in order to insert electronic parts' leads. As shown in FIG. 1, land sides 14a, 14c (or 14b, 14d, neighbor land) are parallel to each other. A wiring pattern may be arranged between the land sides 14a, 14c.

Figure 3:
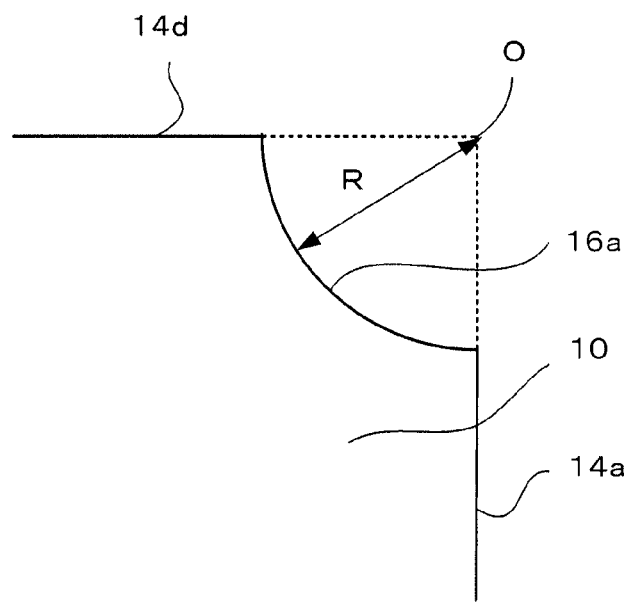
FIG. 3 is a diagram for explaining a circular concave.

The quadrangular land 10 has circular concaves 16a, 16b, 16c and 16d at four corners. A curvature radius R of the circular concaves 16a, 16b, 16c and 16d can be selected at a proper value depending on the material of the solder and the size of the quadrangular land 10. As shown in FIG. 3, the center of the curvature radius R is the cross point 0 at which extensions of one land side and its neighboring land side intersect with each other.

The circular concaves 16a, 16b, 16c and 16d are provided at all the land corners of the quadrangular land 10 so that the solder can be drawn toward the center of the through hole 12. It prevents solder bridges from occurring between the neighboring quadrangular lands 10, 10 (neighbor land). Since a plurality of quadrangular lands 10 are typically two-dimensionally arranged at a high density in the PWB 2, the circular concaves 16a, 16b, 16c and 16d need to be provided at all the land corners of the quadrangular land 10 in order to isotropically draw the solder toward the center of the through hole 12.

As shown in FIG. 1, the land sides 14a, 14c of the quadrangular lands 10, 10 are parallel to each other so that a gap between the quadrangular lands 10, 10 (neighbor land) can be wide. As shown by reference numeral 19 of FIG. 2, the size of the gap between the quadrangular lands 10, 10 (neighbor land) is defined by only the accuracy of drill machining (not shown) which used for machining the through holes 12 on the PWB 2 and the accuracy of the size of the quadrangular lands 10, and thus the gap between the quadrangular land 10 and the neighboring quadrangular land 10 can be wide.

Figure 4:
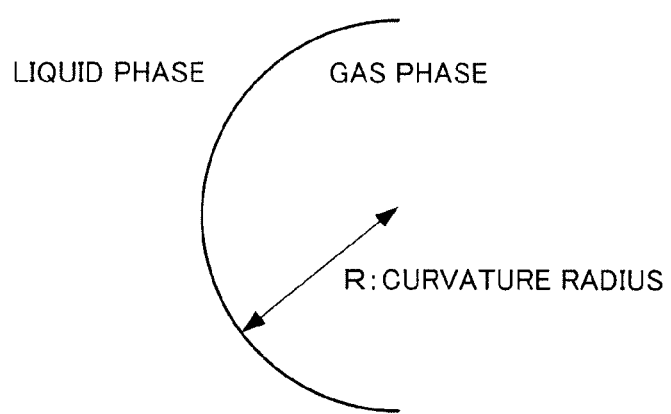
FIG. 4 is a diagram for explaining a principle of the present invention.

A principle in which the solder is drawn toward the center of the through hole 12 is described in FIG. 4. When a liquid phase and a gas phase contact with a curvature radius R as shown in FIG. 4, a pressure difference ΔP occurs between the gas phase and the liquid phase due to surface tension. The pressure difference ΔP can be expressed with Laplace equation in (1).

$$\Delta P = P(\text{Gas phase}) - P(\text{Liquid phase}) = 2\sigma/R \quad (1)$$

ΔP: pressure difference
σ: Surface tension of liquid
R: Curvature radius

Figure 5A:
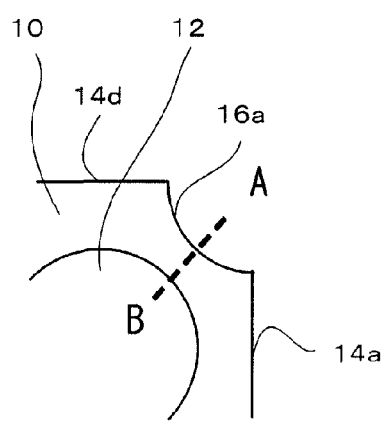
FIGS. 5A and 5B are diagrams for explaining that solder is drawn toward the center of through hole.
Figure 5B:
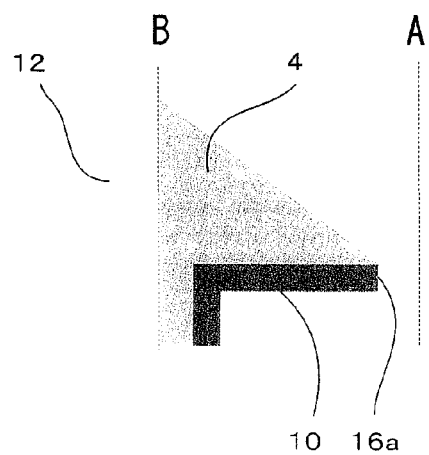

FIGS. 5A and 5B are diagrams for explaining that solder is drawn toward the center of the through hole 12. FIG. 5A shows the circular concave 16a of the quadrangular land 10, and FIG. 5B is a diagram for explaining the cross section at the line AB of FIG. 5A.

The pressure difference which depends on the curvature radius R of the circular concaves at the corners of the quadrangular land 10 acts as a force for drawing solder toward the center of the through hole (the center of the land). When circular concaves are provided at the corners of a land, the pressure difference which depends on the curvature radius R occurs between solder and air. The pressure difference ΔP works also in the cross-sectional direction of fillet and acts as a force which makes the shape of fillets 4 concave toward the center of the land, and thus solder bridges are prevented.

The PWB 2 with the quadrangular lands 10 has been described above. In the present invention, the shape of the lands is not limited to that of the quadrangular lands 10 and hexagonal lands 20 shown in FIG. 6 or octagonal lands 30 shown in FIG. 7 may be employed.

Figure 6:
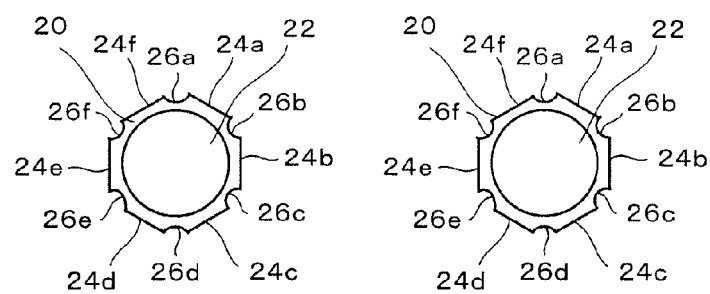
FIG. 6 is a diagram for explaining a case in which lands of the PWB according to the present invention are hexagonal.

The hexagonal land 20 shown in FIG. 6 is formed around a through hole 22 and the land has land sides 24a, 24b, 24c, 24d, 24e, 24f and circular concaves 26a, 26b, 26c, 26d, 26e, 26f.

Figure 7:
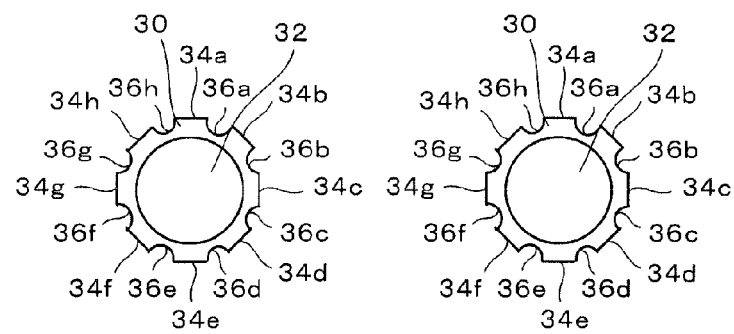
FIG. 7 is a diagram for explaining a case in which lands of the PWB according to the present invention are octagonal.
Figure 8:
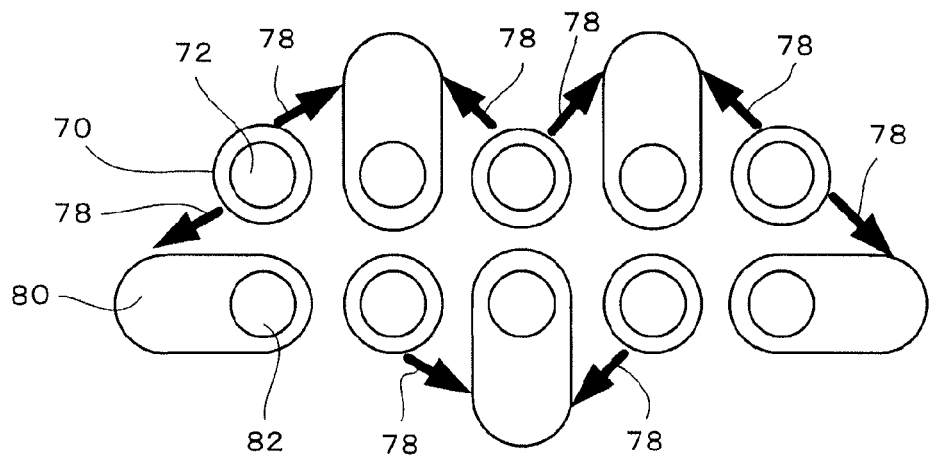
FIG. 8 is a diagram for explaining a conventional technique in which standard lands and longitudinal lands are alternately arranged.
Figure 9:
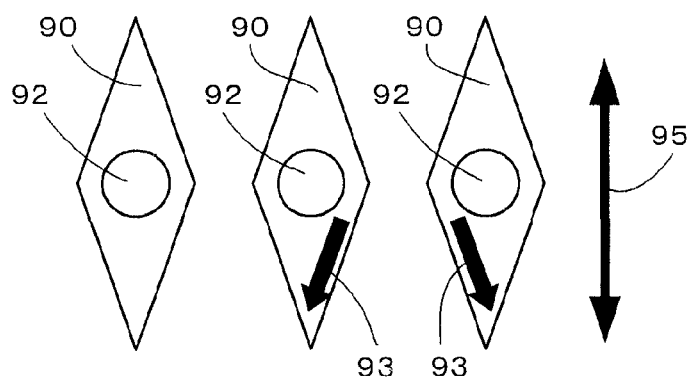
FIG. 9 is a diagram for explaining a conventional technique in which the longest diagonal of a rectangular land matches with a flow carrying direction.
Figure 10A:
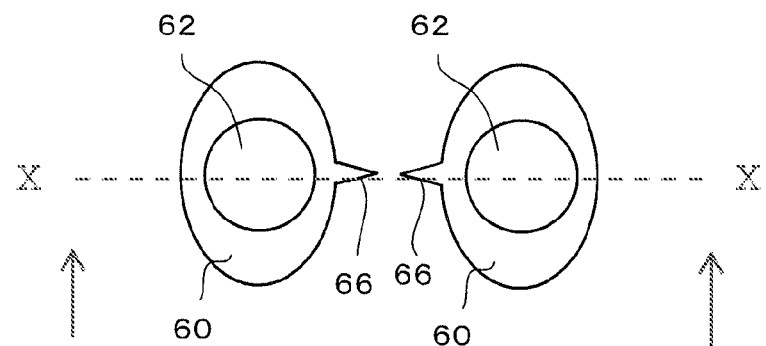
FIGS. 10A and 10B are diagrams for explaining a conventional technique in which protrusions are provided between neighboring lands.
Figure 10B:
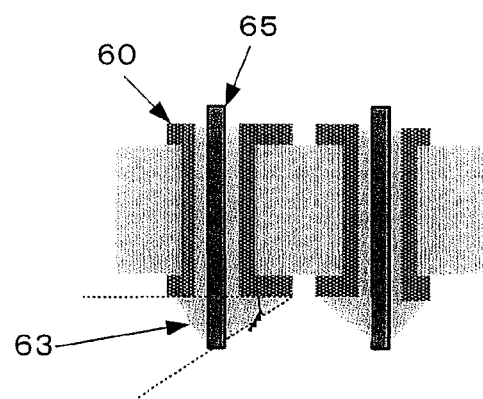
Figure 11A:
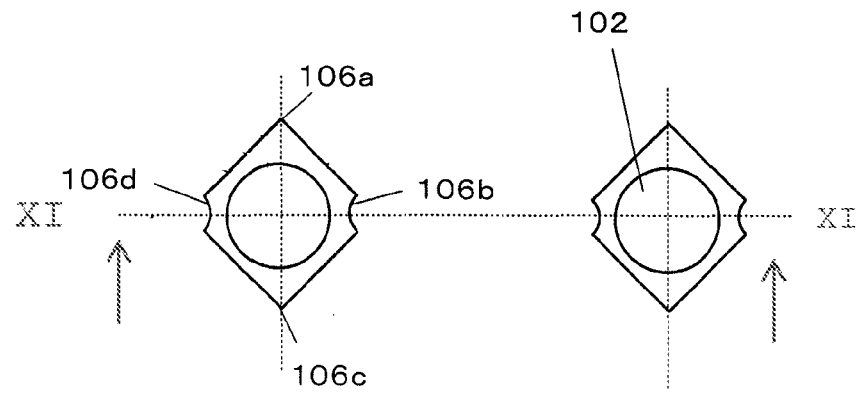
FIGS. 11A and 11B are diagrams for explaining a conventional technique in which solder is drawn into a taper by a semicircular cutout.
Figure 11B:
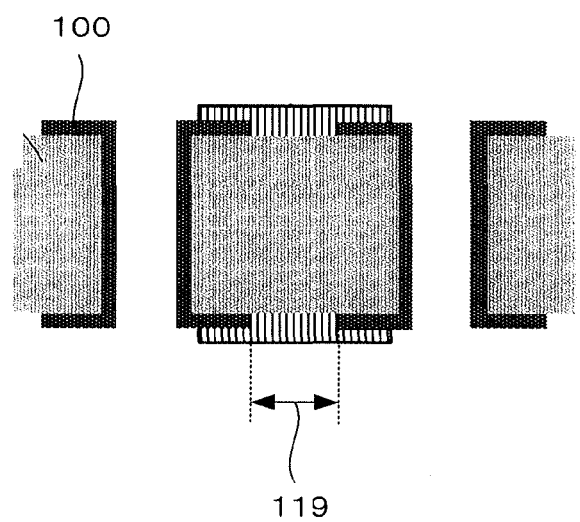

The octagonal land 30 shown in FIG. 7 is formed around a through hole 32, and the land has land sides 34a, 34b, 34c, 34d, 34e, 34f, 34g, 34h and circular concaves 36a, 36b, 36c, 36d, 36e, 36f, 36g, 36h.

A shown in FIGS. 1, 6 and 7, the number of land sides of one land is an even number in the present invention. Thereby, the PWB 2 according to one embodiment of the present invention includes a plurality of through holes 12 into which electronic parts' leads are inserted, and metal plated lands formed around the through holes 12, and the metal plated lands are polygon in which the number of sides is an even number, and each pair of facing sides are parallel, and all the corners of the polygon have circular concaves, and the sides of the land are parallel to the facing sides of the neighboring metal plated lands.

The present invention provides a PWB with lands which has circular concaves at all the land corners. The circular concaves draw solder toward the center of a through hole, and these prevent solder bridges from occurring between neighboring lands. Since the lands are not enlarged, it has advantage in the number of wiring pattern between the lands and achieving high component mounting density.

The invention claimed is:

1. A printed wiring board (PWB), comprising:
   a plurality of through holes into which electronic parts' leads are respectively insertable; and
   a plurality of metal plated lands respectively formed around the through holes, such that each of the metal plated lands is formed in an annular shape with a hole corresponding to each of the through holes, wherein
   a pair of each of the through holes and each of the metal plated lands are formed in a coaxial manner,
   an outer shape of each of the metal plated lands defines a polygon in which the number of sides is an even number, each pair of facing sides are parallel to each other, and each of the metal plated lands has circular concaves at all corners, the metal plated lands are arranged such that the sides of the polygon are parallel to corresponding sides of neighboring metal plated lands, the circular concaves are configured to draw a solder during soldering, and a pressure difference ΔP between a gas phase and a liquid phase of the solder due to a surface tension and a curvature radius R of each of the circular concaves satisfy a Laplace equation in $\Delta P = P(\text{Gas phase}) - P(\text{Liquid phase}) = 2\sigma/R$ where $\sigma$ is the surface tension of liquid.

* * * * *